United States Patent [19]

Sato et al.

[11] Patent Number: 4,701,572
[45] Date of Patent: Oct. 20, 1987

[54] AMORPHOUS SOLAR CELL

[75] Inventors: Kazuhiko Sato; Genshiro Nakamura; Takushi Itagaki, all of Itami, Japan

[73] Assignee: Mitsubishi Denki Kabushiki Kaisha, Tokyo, Japan

[21] Appl. No.: 901,131

[22] Filed: Aug. 28, 1986

[30] Foreign Application Priority Data

Aug. 30, 1985 [JP] Japan .................................. 60-192524

[51] Int. Cl.$^4$ ........................ H01L 31/06; H01L 31/18
[52] U.S. Cl. ..................................... 136/258; 136/249; 357/30; 357/59; 427/39; 427/74
[58] Field of Search ................. 136/258 AM, 249 TJ; 357/30, 59 C; 427/39, 74, 86

[56] References Cited

OTHER PUBLICATIONS

G. Nakamura et al, *Jap. J. Appl. Phys.*, vol. 20 (1981), Supplement 20-1, pp. 291-296.
Y. Kuwano et al, Chapter 3.5 in *Jarect*, vol. 16, Amorphous Semiconductor Technologies & Devices (1984), pp. 113-118.
K. Nozawa et al, Preprint of Spring Meeting Japanese Society Applied Physics, 1983 (including translation), "Production of a-SiGe Light Conductivity Film".
"Structural, Electrical, and Optical Properties of a $Si_{1-x}Ge_x:H$ and an Inferred Electronic Band Structure" by K. D. Mackenzie, et al, *Physical Review B*, vol. 31, No. 4, Feb. 1985, pp. 2198-2212.

*Primary Examiner*—Aaron Weisstuch
*Attorney, Agent, or Firm*—Birch, Stewart, Kolasch & Birch

[57] ABSTRACT

An amorphous solar cell including an amorphous SiGe film which is produced by a glow discharge method using a mixed gas obtained by mixing $Si_2H_6$ and $GeH_4$ or obtained by diluting $Si_2H_6$ and $GeH_4$ with a predetermined dilution gas such that $GeH_4$ to $(Si_2H_6+GeH_4)$ is 0.1 to 0.4.

8 Claims, 4 Drawing Figures

AMORPHOUS SOLAR CELL

FIELD OF THE INVENTION

The present invention relates to an amorphous solar cell which may use an amorphous SiGe film having a high response to long wavelength light, and more particularly to a method of producing an amorphous SiGe film which is capable of preventing exfoliation and exhibits only a little deterioration in its characteristic due to light irradiation.

BACKGROUND OF THE INVENTION

Generally, in order to enhance the efficiency of an amorphous solar cell, an amorphous SiGe film is used as a material which enables effective utilization of long wavelength light which cannot be absorbed by a film including only amorphous Si.

FIG. 3 shows a cross-sectional view of a pin type single element amorphous SiGe solar cell produced on a stainless steel substrate. A cell comprising a P type amorphous Si (or a P type microcrystalline Si) film 2, a non-doped amorphous SiGe film 3, and an n type amphorous Si (or an n type microcrystalline Si) film 4 is produced on the stainless steel substrate 1. A transparent conductive film 5 and a metal electrode 6 are also formed on the cell.

In order to enhance the efficiency, it is rare that an amorphous SiGe cell is used singly as described above, and it is usually used as a bottom cell of a multicell structure as shown in FIG. 4. In FIG. 4, an amorphous SiGe cell is constituted by layers 2, 3, and 4, and cells comprising high band gap material such as amorphous Si are constituted by layers 2, 8, and 4 and 2, 7, and 4.

Conventionally, an amorphous SiGe film having good properties is produced by a plasma CVD method using a mixed gas of $SiH_4$ and $GeH_4$, or a mixed gas obtained by diluting $SiH_4$ and $GeH_4$ with e.g. $H_2$ or He. When the ratio of the flow rate of $GeH_4$ gas to the total gas flow rate is increased, the Ge concentration in the film increases, and the band gap thereof is decreased continuously from about 1.8 eV of amorphous Si. Although the response to long wavelength light then increases, the carrier mobility is decreased with the increase in the Ge concentration. Thus, a practical amorphous SiGe film requires a band gap of above 1.5 eV.

Furthermore, when the film is produced from a mixed gas of $SiH_4$ and $GeH_4$, a high photoconductivity and good film properties are obtained under growth conditions of a relatively low gas pressure and a high RF power. A pin type of an nip type amorphous SiGe solar cell using such a film for a non-doped layer has a response for long wavelength of up to about 800 nm, and a conversion efficiency of about 11% is obtained in a multilayer structure cell including that cell together with a cell using an amorphous Si layer. A further enhancement in the conversion efficiency is expected by an enhancement in the film quality of the amorphous SiGe film. A theoretical conversion efficiency of a triple layer structure element is calculated as 19 to 24%.

On the other hand, the light photoconductivity of an amorphous Si film is reduced by light irradiation. This is the so called Staebler-Wronski effect. The conversion efficiency of a solar cell is also reduced by a long period of light irradiation, and this causes a problem in its reliability. The same effect arises in an amorphous SiGe film, and the solar cell characteristics also deteriorate because of a light irradiation to a degree dependent on the Ge concentration in the film.

Another problem in an amorphous SiGe film produced by the conventional method resides in the fact that exfoliation of the film is likely to arise due to a large internal stress generated in the amorphous SiGe film when the film thickness is increased.

SUMMARY OF THE INVENTION

An object of the present invention is to provide an improved amorphous solar cell which is capable of reducing the internal stress generated in an amorphous SiGe film to a great extent thus preventing exfoliation of the film, and which has less deterioration in its characteristics due to light irradiation.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided an amorphous solar cell including an amorphous SiGe film which is produced by a glow discharge method using a mixed gas obtained by mixing $Si_2H_6$ and $GeH_4$ or obtained by diluting $Si_2H_6$ and $GeH_4$ with a predetermined dilution gas such that the ratio of $GeH_4$ to +$GeH_4$) is 0.1 to 0.4.

DETAILED DESCRIPTION OF THE PREFERRED EMBODIMENTS

An embodiment of the present invention will be described with reference to the drawings. The reason why a mixed gas of $Si_2H_6$ and $GeH_4$ is used and the reason why the ratio of $GeH_4$ to ($Si_2H_6$+$GeH_4$) is 0.1 to 0.4 in the present invention will also be described.

Figure 1:
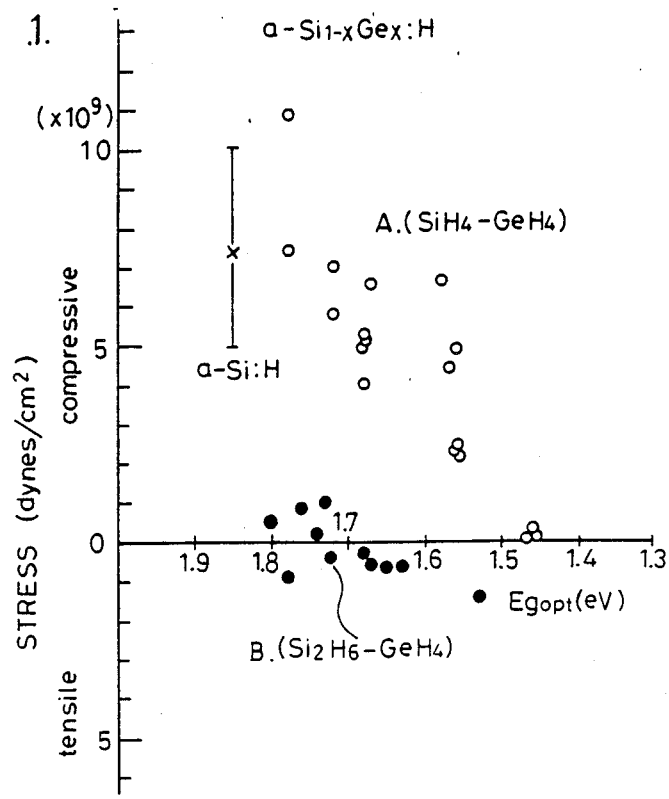
FIG. 1 is a diagram showing the results of the measurement of the internal stress in the amorphous SiGe film used in amorphous solar cells of the present invention and in a conventional device.

FIG. 1 shows the results of the measurement of internal stress in the amorphous SiGe film used in amorphous solar cells of the present invention and in a conventional device. The production conditions are shown in Table 1.

TABLE 1

|  | conventional method | the method of the present invention |
|---|---|---|
| 10% $SiH_4/H_2$ | 250~300 cc |  |
| 10% $Si_2H_6$/He |  | 0~120 cc |
| 10% $GeH_4/H_2$ | 0~50 cc | 180~300 cc |
| RF power | 30~50 W | 20 W |
| gas pressure | 30 Pa | 30 Pa |
| substrate temperature | 230° C. | 230° C. |

In the conventional amorphous SiGe film a large compressive stress of $1 \times 10^{10}$ dyne/cm$^2$ is generated when the Ge concentration is about 10 at%, and the compressive stress is decreased with an increase in the Ge concentration, that is, a decrease in the band gap. However, it has a stress larger than $2 \times 9^{10}$ dyne/cm$^2$ up to a Ge concentration of about 40 at%. On the other hand, in the amorphous SiGe film of the present invention a compressive or tensile stress smaller than $1 \times 10^9$ dyne/cm$^2$ occurs in films having a Ge concentration of 10 to 40 at% (a band gap of 1.8 to 1.6 eV). These films having equal optical gap value exhibit almost no difference in the dark conductivity and the photoconductivity therebetween and have equivalent film quality.

Figure 2:
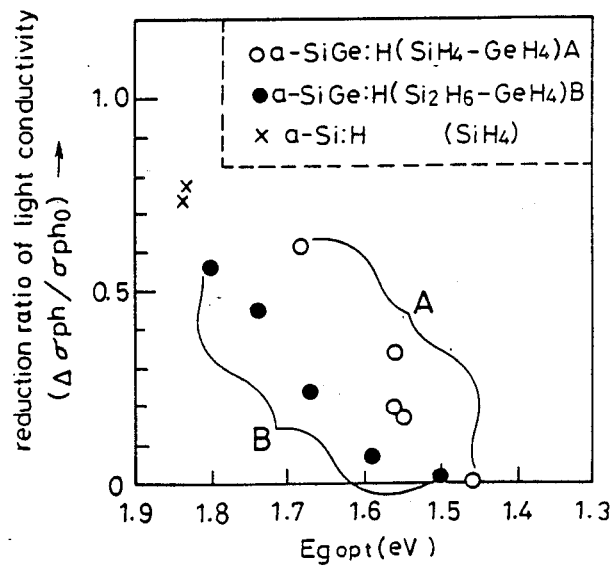
FIG. 2 is a diagram showing the reduction ratio of the photoconductivity due to light irradiation in the amorphous SiGe film used in amorphous solar cells of the present invention and in a conventional device.
Figure 3:
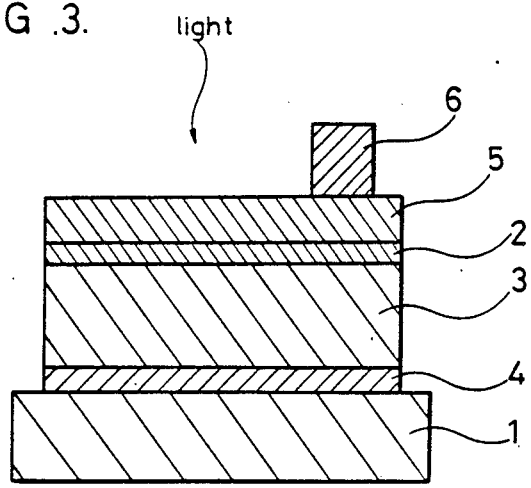
FIGS. 3 and 4 are cross-sectional views showing a conventional amorphous SiGe single and triple layer cell, respectively.
Figure 4:
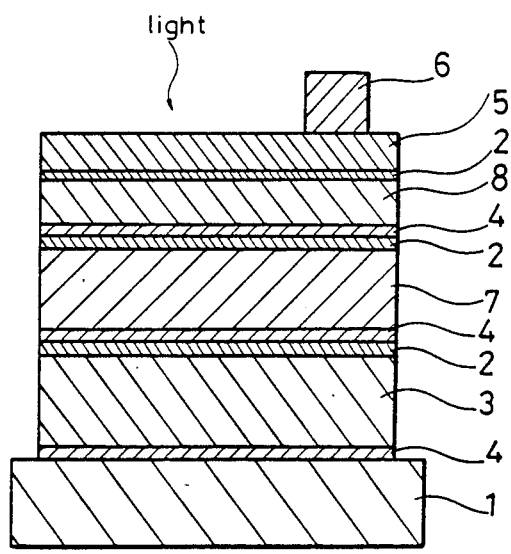

FIG. 2 shows the comparison results of the reduction ratio of the photoconductivity after a light irradiation of AM-1, 100 mW/cm$^2$ (air mass 1) is conducted for four hours on amorphous SiGe films having a Ge concentration of 10 at% to 50 at% made by the present invention and by the conventional method. When films having equal optical gap value are compared, it appears that the films of the present invention have less deterioration in their characteristics than the conventional ones. When a light irradiation of AM-1, 100 mW/cm$^2$ is conducted for 8 hours a solar cell of ITO/nip/S.S structure produced by using these amorphous SiGe films, it is seen that the cell using the amorphous SiGe film of the present invention has less deterioration in its efficiency. In a cell using a conventional film having Ge concentration of 10 at% the efficiency is reduced by about 50% after the light irradiation. This is thought to be caused by a large internal stress generated therein. On the other hand, in a cell of the present invention using a film having a Ge concentration of 10 at% there arises an efficiency reduction of about 20 to 30% after the light irradiation, which is less than for the conventional one.

In the amorphous solar cell of the present invention, exfoliation of a film from the substrate is suppressed, thereby realizing a cell structure having a film thickness in which the internal stress in the film is reduced, thereby resulting in an increase in the film thickness, leading to a realization of a high efficiency cell. Furthermore, the deterioration in the characteristics caused by the increase in the internal stress in the film due to light irradiation is reduced, thereby enabling the production of a high reliability element.

As is evident from the foregoing, according to an amorphous solar cell of the present invention, an amorphous SiGe film is produced by a glow discharge method using a mixed gas of Si$_2$H$_6$ and GeH$_4$ or a mixed gas obtained by diluting Si$_2$H$_6$ and GeH$_4$ with for example H$_2$ or He such that the ratio of GeH$_4$ to (Si$_2$H$_6$+GeH$_4$) is 0.1 to 0.4, whereby the internal stress in the film is reduced, exfoliation of the film from the substrate and the deterioration in its characteristics due to light irradiation can be suppressed.

What is claimed is:

1. An amorphous solar cell including a substrate and an amorphous SiGe film which is produced by a glow discharge method, said glow discharge method utilizing a mixed gas that is obtained by mixing Si$_2$H$_6$ and GeH$_4$ or that is obtained by diluting Si$_2$H$_6$ and GeH$_4$ with a dilution gas, wherein the ratio of GeH$_4$ to (Si$_2$H$_6$+GeH$_4$) in said mixed gas is from 0.1 to 0.4, whereby internal stress, exfoliation, and deterioration due to light irradiation in said solar cell are reduced.

2. The amorphous solar cell as in claim 1, wherein the dilution gas is H$_2$ or He.

3. The amorphous solar cell as in claim 1, wherein the optical gap of the SiGe film is from about 1.5 to 1.7 eV.

4. A method of produding an amorphous solar cell device including a p-i-n cell in contact with a substrate which comprises:
    mixing Si$_2$H$_6$ and GeH$_4$ so that the ratio of GeH$_4$ to (Si$_2$H$_6$+GeH$_4$) is from 0.1 to 0.4 so as to produce a mixed gas and
    producing an amorphous SiGe film over said substrate by employing a glow discharge method which uses said mixed gas.

5. The method as in claim 4, wherein the mixed gas is obtained by diluting Si$_2$H$_6$ and GeH$_4$ with a dilution gas.

6. The method as in claim 5, wherein the dilution gas is H$_2$ or He.

7. The method as in claim 5, wherein the optical gap of the SiGe film is from about 1.5 to 1.7 eV and whereby the internal stress in said SiGe film, exfoliation, and deterioration due to light irradiation are reduced.

8. The method as in claim 4, wherein the optical gap of the SiGe film produced is from about 1.5 to 1.7 eV and whereby internal stress, exfoliation, and deterioration due to light irradiation in the solar cell are reduced.

* * * * *